United States Patent
Kasuya et al.

(10) Patent No.: US 9,036,456 B2
(45) Date of Patent: May 19, 2015

(54) OPTICAL DEVICE, MAGNETIC HEAD, MANUFACTURING METHOD, AND NEAR-FIELD LIGHT DEVICE

(71) Applicant: PIONEER CORPORATION, Kanagawa (JP)

(72) Inventors: Takayuki Kasuya, Kanagawa (JP); Satoshi Sugiura, Kanagawa (JP)

(73) Assignee: PIONEER CORPORATION, Kanagawa (JP)

( * ) Notice: Subject to any disclaimer, the term of this patent is extended or adjusted under 35 U.S.C. 154(b) by 0 days.

(21) Appl. No.: 14/452,798

(22) Filed: Aug. 6, 2014

(65) Prior Publication Data

US 2015/0043319 A1 Feb. 12, 2015

(30) Foreign Application Priority Data

Aug. 6, 2013 (JP) ................. 2013-163331

(51) Int. Cl.
| | |
|---|---|
| G11B 11/00 | (2006.01) |
| G11B 13/08 | (2006.01) |
| G11B 5/31 | (2006.01) |
| H01S 5/10 | (2006.01) |
| H01L 33/48 | (2010.01) |
| G11B 5/00 | (2006.01) |

(52) U.S. Cl.
CPC .............. *G11B 13/08* (2013.01); *G11B 5/3163* (2013.01); *H01S 5/1071* (2013.01); *H01L 33/48* (2013.01); *G11B 5/314* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 8,286,329 B1 | 10/2012 | Zhao et al. | |
| 8,842,383 B1 * | 9/2014 | Balamane et al. | 360/31 |
| 2002/0141118 A1 | 10/2002 | Nemoto | |
| 2009/0262448 A1 * | 10/2009 | Shimazawa et al. | 360/59 |
| 2010/0061200 A1 * | 3/2010 | Shimazawa et al. | 369/13.33 |
| 2010/0085846 A1 * | 4/2010 | Shimazawa et al. | 369/13.14 |
| 2010/0157745 A1 | 6/2010 | Okada et al. | |
| 2010/0157746 A1 | 6/2010 | Hongo | |
| 2011/0170381 A1 * | 7/2011 | Matsumoto | 369/13.33 |
| 2012/0092973 A1 * | 4/2012 | Imada et al. | 369/13.32 |
| 2013/0016591 A1 * | 1/2013 | Tomikawa et al. | 369/13.02 |
| 2014/0050486 A1 * | 2/2014 | Bain et al. | 398/118 |
| 2014/0285919 A1 * | 9/2014 | Tanaka et al. | 360/59 |

FOREIGN PATENT DOCUMENTS

| | | |
|---|---|---|
| JP | 2002-298312 | 10/2002 |
| JP | 2003-045004 | 2/2003 |
| JP | 2007-335028 | 12/2007 |
| JP | 2009-060057 | 3/2009 |
| JP | 2009-163834 | 7/2009 |
| JP | 2010-146655 | 7/2010 |
| JP | 2010-146663 | 7/2010 |

* cited by examiner

*Primary Examiner* — Paul Huber
(74) *Attorney, Agent, or Firm* — Young & Thompson

(57) ABSTRACT

An near-field light device (100) is provided with: a first electrode layer (123) having a protruding portion (123*a*); a second electrode layer (121); and a light emitting layer (122), the protruding portion protrudes along a predetermined direction (Y axis direction) to be capable of extracting energy which is caused by emission of light at the light emitting layer, the predetermined direction intersects with a laminated direction (X axis direction) of the near-field light device, an edge surface of at least one portion of the projection portion is located at more outward side in the optical device than an edge surface of the second electrode layer is.

9 Claims, 10 Drawing Sheets

OPTICAL DEVICE, MAGNETIC HEAD, MANUFACTURING METHOD, AND NEAR-FIELD LIGHT DEVICE

CROSS-REFERENCE TO RELATED APPLICATIONS

This application is based upon and claims the benefit of priority of the prior Japanese Patent Application No. 2013-163331, file on Aug. 6, 2013, the entire contents of which are incorporated herein by reference.

This application is based upon and claims the benefit of priority of the prior Japanese Patent Application No. 2012-177069, file on Aug. 9, 2012, the entire contents of which are incorporated herein by reference.

TECHNICAL FIELD

The present invention relates to an optical device which is configured to form a nano spot on which energy is focused by using light, a magnetic head which is provided with this kind of the optical device, a manufacturing method of manufacturing this kind of the optical device or this kind of the magnetic head, and a near-field light device which is configured to form a nano spot on which energy is focused by using near-field light.

BACKGROUND ART

A HAMR (Heat Assisted Magnetic Recording) method draws attention as a technology which is capable of further high density magnetic recording. As the heat assisted magnetic recording method, a technology which transforms laser light to near-field light at a near-field light generator and performs a magnetic recording while locally increasing a temperature of a magnetic recording medium by irradiating one portion of a surface of the magnetic recording medium with the transformed near-field light is proposed (See Patent Literatures 1 to 8).

CITATION LIST

Patent Literature

Patent Literature: Japanese Patent Application Laid Open No. 2007-335028
Patent Literature 2: U.S. Pat. No. 8,286,329
Patent Literature 3: Japanese Patent Application Laid Open No. 2002-298312
Patent Literature 4: Japanese Patent Application Laid Open No. 2009-060057
Patent Literature 5: Japanese Patent Application Laid Open No. 2009-163834
Patent Literature 6: Japanese Patent Application Laid Open No. 2010-146655
Patent Literature 7: Japanese Patent Application Laid Open No. 2010-146663
Patent Literature 8: Japanese Patent Application Laid Open No. 2003-045004

SUMMARY OF INVENTION

Technical Problem

The present invention has an object to provide an optical device which is configured to effectively form a nano spot on which energy is focused by using light, a magnetic head which is provided with this kind of the optical device, a manufacturing method of manufacturing this kind of the optical device or this kind of the magnetic head, and a near-field light device which is configured to generate near-field light whose size is micro and to form a nano spot on which energy based on the near-field light is focused.

Solution to Problem

An optical device is provided with: a first electrode layer having a protruding portion; a second electrode layer; and a light emitting layer which is sandwiched between the first electrode layer and the second electrode layer, wherein the protruding portion protrudes along a predetermined direction to be capable of extracting energy which is caused by emission of light at the light emitting layer, wherein the predetermined direction intersects with a laminated direction along which the first electrode layer, the second electrode layer and the light emitting layer are laminated, an edge surface of at least one portion of the projection portion is located at more outward side in the optical device along the predetermined direction than an edge surface of the second electrode layer is.

A first magnetic head is provided with: a first electrode layer; a second electrode layer: a light emitting layer which is sandwiched between the first electrode layer and the second electrode layer; and a magnetic device which performs at least one of a recording operation and a reproducing operation with respect to a magnetic recording medium, wherein the first electrode layer has a generator which generates near-field light and which is exposed to a ABS (Air Bearing Surface) surface of the magnetic head.

A second magnetic head is provided with: an optical device; and a magnetic device which is performs at least one of a recording operation and a reproducing operation with respect to a medium, wherein the optical device is provided with: a first electrode layer having a protruding portion; a second electrode layer; and a light emitting layer which is sandwiched between the first electrode layer and the second electrode layer, the protruding portion protrudes along a predetermined direction to be capable of forming a heat spot on the medium which faces the optical device by extracting energy which is caused by emission of light at the light emitting layer, wherein the predetermined direction intersects with a laminated direction along which the first electrode layer, the second electrode layer and the light emitting layer are laminated, an edge surface of at least one portion of the projection portion is located at more outward side in the optical device than an edge surface of the second electrode layer is.

A first manufacturing method is a manufacturing method of manufacturing the above described optical device, the manufacturing method is provided with: a first process of forming one of the first electrode layer and the second electrode layer; a second process of forming the light emitting layer such that the light emitting layer is laminated on the one of the first electrode layer and the second electrode layer; and a third layer of forming the other one of the first electrode layer and the second electrode layer such that the other one of the first electrode layer and the second electrode layer is laminated on the light emitting layer.

A second manufacturing method is a manufacturing method of manufacturing the above described magnetic head, the manufacturing method is provided with: a first process of forming the magnetic device; a second process of forming one of the first electrode layer and the second electrode layer such that one of the first electrode layer and the second electrode layer is laminated on the magnetic device; a third process of forming the light emitting layer such that the light emitting layer is laminated on the one of the first electrode layer and the second electrode layer; and a fourth process of forming the other one of the first electrode layer and the second electrode layer such that the other one of the first electrode layer and the second electrode layer is laminated on the light emitting layer.

A first near-field light device is provided with: a micro resonator which is capable of storing energy therein by receiving light; and a generator which is located to contact with a side surface of the micro resonator or is located at a vicinity of the micro resonator and which is capable of extracting at least one portion of energy stored in the micro resonator and thus generating near-field light, wherein the micro resonator is a disk-shaped resonator in which a hole is formed, a center of the hole formed in the micro resonator is away from a center of a top surface of the micro resonator, in a planar view viewed from a top side of the micro resonator.

A second near-field light device is provided with: a micro resonator which is capable of storing energy therein by receiving light and which is disk-shaped; and a generator which is located to contact with a side surface of the micro resonator or is located at a vicinity of the micro resonator and which is capable of extracting at least one portion of energy stored in the micro resonator and thus generating near-field light, wherein the micro resonator has a tip which faces the generator.

A third near-field light device is provided with: a micro resonator which is capable of storing energy therein by receiving light and which is disk-shaped; and a generator which is located to contact with a side surface of the micro resonator or is located at a vicinity of the micro resonator and which is capable of extracting at least one portion of energy stored in the micro resonator and thus generating near-field light, wherein the micro resonator has: a first portion which is made from one type of material; and a second portion which is made from another type of material which is different from the one type of material.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Figure 1A:
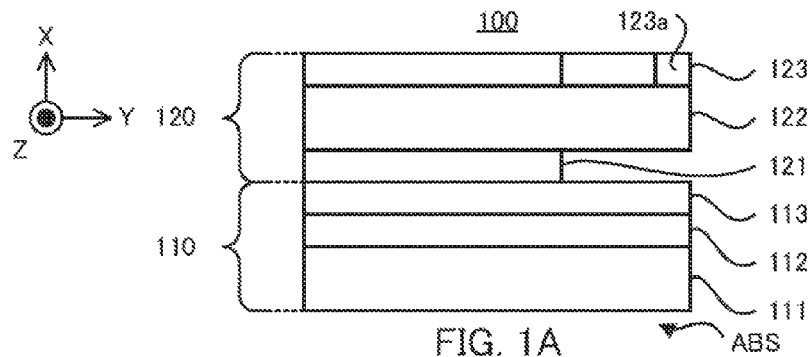
FIG. 1A is a side view illustrating a configuration of a magnetic head in the first example.

Hereinafter, an embodiment of an optical device, an embodiment of a magnetic head and an embodiment of a manufacturing method will be explained with reference to the drawings.

(Embodiment of Optical Device)
<1>

An optical head in the present embodiment is provided with a first electrode layer having a protruding portion; a second electrode layer; and a light emitting layer which is sandwiched between the first electrode layer and the second electrode layer, wherein the protruding portion protrudes along a predetermined direction to be capable of extracting energy which is caused by emission of light at the light emitting layer, wherein the predetermined direction intersects with a laminated direction along which the first electrode layer, the second electrode layer and the light emitting layer are laminated, an edge surface of at least one portion of the projection portion is located at more outward side in the optical device along the predetermined direction than an edge surface of the second electrode layer is.

According to the optical device in the present embodiment, the first electrode layer, the second electrode layer and the light emitting layer are laminated. The light emitting layer emits light in accordance with voltage which is applied to the first electrode layer and the second electrode layer. Due to the emission of the light in the light emitting layer, the energy is propagated from the light emitting layer to the protruding portion described later.

The first electrode layer has the protruding portion which is capable of extracting (typically, extracting toward the outside of the optical device) the energy which is caused by the emission of the light in the light emitting layer. Therefore, the energy which is propagated from the light emitting layer to the protruding portion due to the emission of the light in the light emitting layer is extracted toward the outside of the optical device (for example, a medium which faces the optical device) by the protruding portion. This energy may be extracted as light (for example, near-field light), for example.

The protruding portion protrudes along the predetermined direction which intersects the laminated direction of the optical device. Namely, the protruding portion protrudes toward the outward side in the optical device along the predetermined direction such that one portion of the first electrode layer which corresponds to the protruding portion is located at more outward side in the optical device along the predetermined direction than another one portion of the first electrode layer which is located around the protruding portion and which does not correspond to the protruding portion is.

In addition, the edge surface of at least one portion of the projection portion is located at more outward side in the optical device along the predetermined direction than the edge surface of the second electrode layer is. Namely, the edge surface of at least one portion of the projection portion is closer to the outside of the optical device along the predetermined direction than the edge surface of the second electrode layer is. Namely, a distance along the predetermined direction from the edge surface of at least one portion of the projection portion to the outside of the optical device is smaller than a distance along the predetermined direction from the edge surface of the second electrode layer to the outside of the optical device.

According to the optical device in the present embodiment, the energy caused by the emission of the light in the light emitting layer can be extracted more easily by the protruding portion, because the first electrode layer has the protruding portion, compared to an optical device in which the first electrode does not have the protruding portion. Therefore, the optical device is capable of effectively forming a nano spot on which the energy is focused.

In addition, since the edge surface of at least one portion of the projection portion is located at more outward side in the optical device than the edge surface of the second electrode layer is, the energy caused by the emission of the light in the light emitting layer can be extracted by the first electrode layer (typically, the protruding portion which the first electrode layer has) more easily rather than by the second electrode layer. Therefore, the optical device is capable of intensively extracting the energy caused by the emission of the light in the light emitting layer via the first electrode layer (typically, the protruding portion which the first electrode layer has). In other words, the energy caused by the emission of the light in the light emitting layer is not likely distributed to both of the first electrode layer and the second electrode layer. Therefore, the optical device is capable of effectively forming the nano spot on which the energy is focused.

In addition, according to the optical device in the present embodiment, since the light emitting layer is sandwiched by the first electrode layer having the protruding portion, the energy caused by the emission of the light in the light emitting layer can be directly extracted from the protruding portion via the first electrode layer which is adjacent to the light emitting layer which is a generation source of the energy. Namely, according to the optical device in the present embodiment, since the light emitting layer and the protruding portion are not located in positions which are physically away from each other (in other words, in separated positions), the optical device does not necessarily have a light guiding path which guides the light from the light emitting layer to the protruding portion which are physically away from each other. As a result, the optical device in the present embodiment is capable of effectively using the energy caused by the emission of the light in the light emitting layer, because the loss of the light in the light guiding path is reduced. Namely, the optical device is capable of effectively forming the nano spot on which the energy is focused.

<2>

In an another aspect of the optical device in the present embodiment, the optical device is further provided with a facing surface which faces a desired medium along the predetermined direction, the edge surface of at least one portion of the projection portion is closer to the facing surface than the edge surface of the second electrode layer is.

According to this aspect, the "outward side in the optical device" is substantially same as the "side at which the facing surface of the optical device is located (namely, the side at which the medium facing the optical device is located)". Namely, the "direction toward the outward side in the optical device" is substantially same as the "direction toward the side at which the facing surface of the optical device is located (namely, the direction toward the side at which the medium facing the optical device is located)". As a result, the optical device can appropriately enjoy the above described various effect.

<3>

In an another aspect of the optical device in the present embodiment, the protruding portion generates near-field light by extracting the energy which is caused by the emission of the light at the light emitting layer.

According to this aspect, the protruding portion is capable of generating the near-field light by extracting the energy caused by the emission of the light at the light emitting layer. In other words, the protruding portion is capable of extracting the energy caused by the emission of the light at the light emitting layer as the near-field light. In this case, the optical device may be used as a near-field light device.

(Embodiment of Magnetic Head)

<4>

A magnetic head in the first embodiment is provided with a first electrode layer; a second electrode layer; a light emitting layer which is sandwiched between the first electrode layer and the second electrode layer; and a magnetic device which performs at least one of a recording operation and a reproducing operation with respect to a magnetic recording medium, wherein the first electrode layer has a generator which generates near-field light and which is exposed to a ABS (Air Bearing Surface) surface of the magnetic head.

According to the magnetic head in the first embodiment, one portion of the first electrode layer functions as the generator which generates the near-field light. Thus, the magnetic head in the first embodiment is capable of functioning as a magnetic head which can be easily fabricated (worked) industrially and which performs a heat assisted magnetic recording with relative high conversion efficiency of the energy.

<5>

A magnetic head in the second embodiment is provided with an optical device; and a magnetic device which is performs at least one of a recording operation and a reproducing operation with respect to a medium, wherein the optical device is provided with: a first electrode layer having a protruding portion; a second electrode layer; and a light emitting layer which is sandwiched between the first electrode layer and the second electrode layer, the protruding portion protrudes along a predetermined direction to be capable of forming a heat spot on the medium which faces the optical device by extracting energy which is caused by emission of light at the light emitting layer, wherein the predetermined direction intersects with a laminated direction along which the first electrode layer, the second electrode layer and the light emitting layer are laminated, an edge surface of at least one portion of the projection portion is located at more outward side in the optical device than an edge surface of the second electrode layer is.

According to the magnetic head in the second embodiment, the magnetic head is configured by laminating the above described optical device in the present embodiment (including various aspects) and the magnetic device.

The optical device forms the heat spot (namely, an area portion to which a heating process or a cooling process is locally performed) on the medium which faces the optical device. The magnetic device performs at least one of the recording operation (for example, a signal recording operation for recording a signal into the medium by using a writing magnetic pole) and the reproducing operation (for example, a signal reproducing operation for reproducing a signal from the medium by using a reading magnetic pole) with respect to the medium.

It is preferable that the magnetic device perform the recording operation in accordance with the heat spot which is formed on the medium by the optical device. For example, the magnetic device is capable of performing the recording operation while solving the problem of heat fluctuation by applying magnetic field to the medium whose magnetic coercive force is reduced.

The magnetic head in the second embodiment can appropriately enjoy effects which are same as various effects which the above described optical device in the present embodiment can enjoy, because the magnetic head in the second embodiment is provided with the above described optical device in the present embodiment.

Incidentally, the magnetic head in the first embodiment or the second embodiment can adopt various aspects in accordance with various aspects which the above described optical device in the present embodiment can adopt.

<6>

In an another aspect of the magnetic head in the first embodiment or the second embodiment, the second electrode layer is closer to the magnetic device than the first electrode layer is.

According to this aspect, the first electrode layer which is provided with the protruding portion for forming the heat spot can be away from the magnetic device, compared in the case where the first electrode layer is closer to the magnetic device than the second electrode layer is. Thus, an adverse effect to the magnetic device caused by the protruding portion for forming the heat spot (for example, an adverse effect to at least one of the recording operation and the reproducing operation which the magnetic device performs) can be reduced or eliminated.

(Embodiment of Manufacturing Method)

<7>

A manufacturing method in the first embodiment is a manufacturing method of manufacturing the above described optical device in the present embodiment (including various aspects), the manufacturing method is provided with: a first process of forming one of the first electrode layer and the second electrode layer; a second process of forming the light emitting layer such that the light emitting layer is laminated on the one of the first electrode layer and the second electrode layer; and a third layer of forming the other one of the first electrode layer and the second electrode layer such that the other one of the first electrode layer and the second electrode layer is laminated on the light emitting layer.

According to the manufacturing method in the first embodiment, the optical device in the present embodiment can be manufactured by using a laminating process (for example, a semiconductor manufacturing process) for laminating the first electrode layer, the second electrode layer and the light emitting layer. Therefore, the manufacturing method in the first embodiment is capable of manufacturing the optical device in the present embodiment effectively or relatively easily.

Incidentally, the manufacturing method in the first embodiment can adopt various aspects in accordance with various aspects which the above described optical device in the present embodiment can adopt.

<8>

In an another aspect of the manufacturing method in the first embodiment, the manufacturing method is further provided with: a fourth process of patterning the first electrode layer such that one portion of the first electrode layer protrudes along the predetermined direction and thus the first electrode is to have the protruding portion; and a fifth process of eliminating one portion of the second electrode layer such that the edge surface of at least one portion of the projection portion is located at more outer side in the optical device than the edge surface of the second electrode layer is.

According to this aspect, the first electrode layer which has the protruding portion having the above described characters can be formed effectively or relatively easily.

<9>

A manufacturing method in the second embodiment is a manufacturing method of manufacturing the above described magnetic head in the first embodiment or the second embodiment, the manufacturing method is provided with: a first process of forming the magnetic device; a second process of forming one of the first electrode layer and the second electrode layer such that one of the first electrode layer and the second electrode layer is laminated on the magnetic device; a third process of forming the light emitting layer such that the light emitting layer is laminated on the one of the first electrode layer and the second electrode layer; and a fourth process of forming the other one of the first electrode layer and the second electrode layer such that the other one of the first electrode layer and the second electrode layer is laminated on the light emitting layer.

According to the manufacturing method in the second embodiment, the magnetic head in the first embodiment or the second embodiment can be manufactured by using a laminating process (for example, a semiconductor manufacturing process) for laminating the magnetic device and the optical device (namely, for laminating the magnetic device, the first electrode layer, the second electrode layer and the light emitting layer). Therefore, the manufacturing method in the second embodiment is capable of manufacturing the magnetic head in the first embodiment or the second embodiment effectively or relatively easily.

Especially, the manufacturing method in the second embodiment is capable of manufacturing the magnetic head without boding the magnetic device and the optical device after manufacturing the magnetic device and the optical device separately. Therefore, the manufacturing method in the second embodiment is capable of reducing the manufacturing cost of the magnetic head, because the manufacturing method in the second embodiment is capable of reducing the manufacturing process of the magnetic head.

Incidentally, the manufacturing method in the second embodiment can adopt various aspects in accordance with various aspects which the above described magnetic head in the first embodiment or the second embodiment or the above described manufacturing method in the first embodiment can adopt.

These operation and other advantages in the embodiment will become more apparent from the examples explained below.

As explained above, the optical device in the present embodiment is provided with the first electrode layer having the protruding portion, the second electrode layer and the light emitting layer. The magnetic head in the first embodiment is provided with the first electrode layer, the second electrode layer, the light emitting layer and the magnetic device. The magnetic head in the second embodiment is provided with the optical device in the present embodiment and the magnetic device. The manufacturing method in the first embodiment is provided with the first process, the second process and the third process. The manufacturing method in the second embodiment is provided with the first process, the second process, the third process and the fourth process. Therefore, the nano spot on which the energy is focused can be generated effectively.

EXAMPLES

Next, with reference to drawings, an example of the optical device, an example of the magnetic heat, an example of the manufacturing method and an example of the near-field light device will be explained. Incidentally, in the drawings which is referred in the below explanation, each layer and each element are rescaled for the purpose of clearer explanation.

(1) First Example

Firstly, with reference to FIG. 1 to FIG. 11, a first example of an optical device, a first example of a magnetic and a first example of a manufacturing method will be explained. Incidentally, in the first example, a near-field light device is used as one example of the optical device.

(1-1) Configuration of Magnetic Head

Figure 1B:
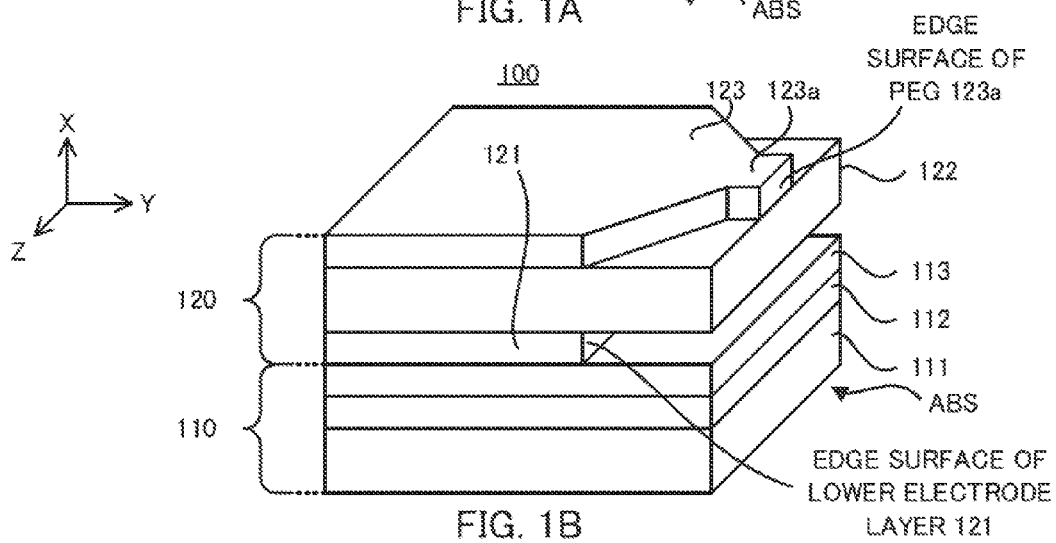
FIG. 1B is a perspective view illustrating a configuration of the magnetic head in the first example.
Figure 1C:
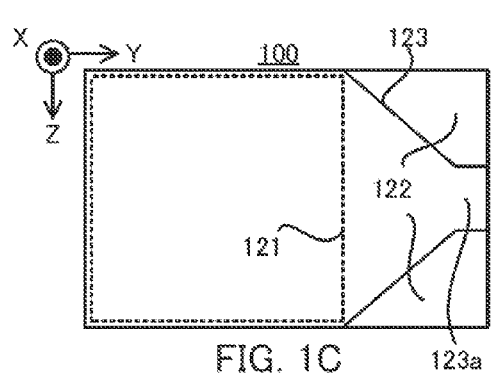
FIG. 1C is a top view illustrating a configuration of the magnetic head in the first example.
Figure 1D:
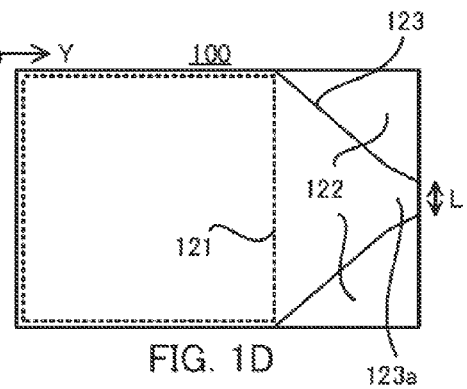
FIG. 1D is a top view illustrating a configuration of the magnetic head in the first example and FIG. 1E is a top view illustrating a configuration of the magnetic head in the first example.
Figure 1E:
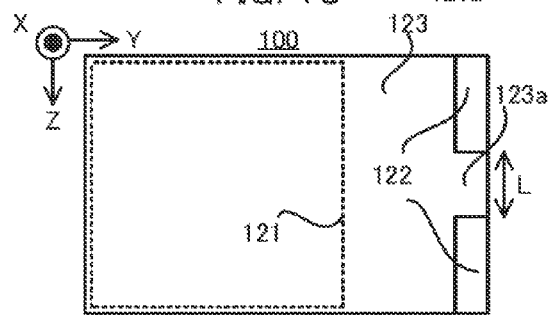
Figure 2:
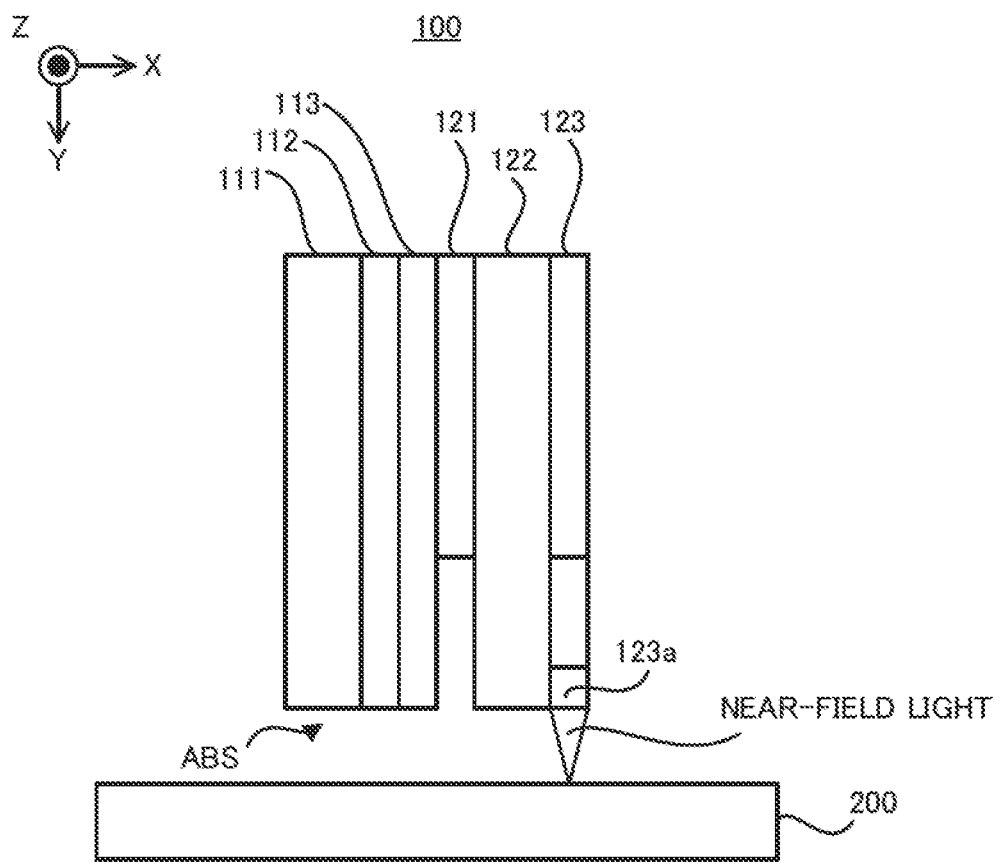
FIG. 2 is a side view illustrating a positional relationship between the magnetic head in the first example and a magnetic recording medium.

Firstly, with reference to FIG. 1A, FIG. 1B, FIG. 1C, FIG. 1D, FIG. 1E and FIG. 2, a configuration of the magnetic head 100 in the first example will be explained. FIG. 1A is a side view illustrating a configuration of the magnetic head 100 in the first example, FIG. 1B is a perspective view illustrating a configuration of the magnetic head 100 in the first example, FIG. 1C is a top view illustrating a configuration of the magnetic head 100 in the first example, FIG. 1D is a top view illustrating a configuration of the magnetic head 100 in the first example and FIG. 1E is a top view illustrating a configuration of the magnetic head 100 in the first example. FIG. 2 is a side view illustrating a positional relationship between the magnetic head 100 in the first example and a magnetic recording medium 200.

As illustrated in FIG. 1A, FIG. 1B and FIG. 1C, the magnetic head 100 in the first example is provided with: a magnetic device 110 and a near-field light device 120 which is one example of the "optical device". Incidentally, as illustrated in FIG. 2, one surface of the magnetic head 100 is a facing surface (what we call ABS (Air Bearing Surface)) which faces the magnetic recording medium 200.

Incidentally, a length of the magnetic head 100 along an X axis may be 2 to 3 micro meter, for example. However, the length of the magnetic head 100 along the X axis may be different from 2 to 3 micro meter, for example. Moreover, a length of the magnetic head 100 along a Z axis may be 5 micro meter, for example. However, the length of the magnetic head 100 along the Z axis may be different from 5 micro meter, for example.

The magnetic device 110 applies magnetic field to the magnetic recording medium 200 including magnetic material by using non-illustrated writing magnetic pole and thus records a signal into a nano area of the magnetic recording medium 200. In addition, the magnetic device 110 detects a change of the magnetic field in the nano area of the magnetic recording medium 200 by using non-illustrated reading magnetic pole and thus reproduces the signal recorded in the nano area of the magnetic recording medium 200.

The magnetic device 110 has a structure in which a substrate 111 including $Al_2O_3$—TiC (ALTIC), a magnetic head layer (lamination element) 112 including the writing magnetic pole and the reading magnetic pole each of which is made from a coil and a magnetic element, and a separating layer 113 including a magnetic element such as NiFe and the like are laminated in this order, for example. Incidentally, a magnetic pole (what we call a recording magnetic pole or the writing magnetic pole) which is used to record the signal and a magnetic pole (what we call a reproducing magnetic pole or the reading magnetic pole) which is used to reproduce the signal may be separately formed on a surface (what we call the ABS) of the magnetic head layer 112 which faces the magnetic recording medium 200 (see FIG. 18 described later), although these magnetic poles are not illustrated in FIG. 1A to FIG. 1E and FIG. 2 for the purpose of simplicity of these drawings. However, single magnetic pole which is used to record and reproduce the signal may be formed on the surface of the magnetic head layer 112 which faces the magnetic recording medium 200.

The near-field light device 120 focuses the energy on the nano area of the magnetic recording medium 200 to which the magnetic device 110 applies the magnetic field, to assist the recording of the signal by the magnetic device 110. Specifically, the near-field light device 120 focuses the energy on the nano area of the magnetic recording medium 200 by using the near-field light and increases temperature the nano area. Namely, the magnetic head in the first example is a magnetic head which performs a HAMR (Heat Assisted Magnetic Recording).

The near-field light device 120 has a structure in which a lower electrode layer 121 which is one example of the "second electrode layer", a light emitting layer 122 and an upper electrode layer 123 which is one example of the "first electrode layer" are laminated in this order. Incidentally, it is preferable that the lower electrode layer 121 be closer to the magnetic device 110 than the upper electrode layer 123 is. Namely, it is preferable that the lower electrode layer 121, the light emitting layer 122 and the upper electrode layer 123 be laminated in this order on the separating layer 113 which the magnetic device 110 is provided with. However, the upper electrode layer 123 may be closer to the magnetic device 110 than the lower electrode layer 121 is. Namely, the upper electrode layer 123, the light emitting layer 122 and the lower electrode layer 121 may be laminated in this order on the separating layer 113 which the magnetic device 110 is provided with.

Incidentally, a protecting layer (for example, a protection layer including a dielectric substance as its material) which is used to protect the near-field light device 120 may be further laminated on the upper electrode layer 123.

The lower electrode layer 121 is an electrode which is used to apply voltage to the light emitting layer 122. A material of the lower electrode layer 121 may be a single metal such as Ag, Cu or Au, or may be an alloy of at least two of Ag, Cu and Au.

It is preferable that an etching character (for example, an etching rate) of the lower electrode layer 121 be different from that of the upper electrode layer 123. However, if the lower electrode layer 121 and the upper electrode layer 123 can be separately etched by using an etching mask, the etching character of the lower electrode layer 121 may be same as that of the upper electrode layer 123. For example, the material of the lower electrode layer 121 may be same as that of the upper electrode layer 123.

The light emitting layer 122 is sandwiched between the lower electrode layer 121 and the upper electrode layer 123. The light emitting layer 122 emits light in accordance with the voltage which is applied to the light emitting layer 122 from the lower electrode layer 121 and the upper electrode layer 123. Thus, the light emitting layer 122 may have a LD (Laser Diode), a LED (Light Emitting Diode), an organic EL (Electro Luminescence) or the like. Alternatively, the light emitting layer 122 may have a Si which is capable of generating surface Plasmon described layer.

Incidentally, the light emitting layer 122 may be made of a GaAs substrate which has a plurality of quantum dots (or a plurality of metal nano-particles) made from an InAs or the like, for example. In this case, the light emitting layer 122 may be a light emitting layer in a plural layer quantum dot type in which the plurality of quantum dots have a multi layer structure (for example, a structure in which a plurality of layers (for example, three to one hundred layers) each of which has one or more quantum dots are laminated along the X axis). Alternatively, the light emitting layer 122 may be a light emitting layer in a distributed quantum dot type in which the plurality of quantum dots are distributed in the light emitting layer 122.

The upper electrode layer 123 is an electrode which is used to apply voltage to the light emitting layer 122. A material of the upper electrode layer 123 may be a single metal such as Ag, Cu or Au, or may be an alloy of at least two of Ag, Cu and Au.

The upper electrode layer 123 functions as an electrode which supplies an electric current to the light emitting layer 122. The upper electrode layer 123 further functions as a NFT (Near-Field Transducer, a near-field light generator) which generates the near-field light. The upper electrode layer 123 further propagate the energy of the light which is emitted from the light emitting layer 122 to the NFT and thus focuses the energy on the NFT. In the example illustrated in FIG. 1A to FIG. 1E, the peg 123a which is one example of the "protruding portion" is the NFT.

The peg 123a is located on a center of the magnetic head 100 along the Z axis. An edge surface of the peg 123a contacts with the ABS. The near-field light is generated at the peg 123a and then the energy is focused on the nano area of the magnetic recording medium 200 from the edge surface of the peg 123a. As a result, the nano area of the magnetic recording medium 200 is heated. A length L of the edge surface of the peg 123 is determined depending on at least one of a designed recording density, a designed track pitch, a designed bit length, a designed bit width and the like. It is preferable that the length L of the edge surface of the peg 123 be a few nano-meter to a few dozen nano-meter. If the length L is reduced, a size of a recording mark can be reduced and thus the recording density can be improved.

Namely, in the first example, since at least one portion of the upper electrode layer 123 which contacts with the ABS protrudes, the energy of the light which is emitted from the light emitting layer 122 can be effectively propagated to the NFT.

The peg 123a may gradually narrow to the edge surface of the peg 123a (may gradually taper toward the edge surface of the peg 123a) such that the length L of the edge surface of the peg 123a becomes a length corresponding to the designed recording density. For example, FIG. 1C illustrates an example in which the peg 123a gradually narrows to the ABS at a constant rate such that the length L of the edge surface of the peg 123a becomes the length corresponding to the designed recording density. For example, FIG. 1D illustrates an example in which the peg 123a gradually narrows to the ABS at a first constant rate and then the peg 123a gradually narrows to the ABS at a second constant rate. For example, FIG. 1E illustrates an example in which the length of the peg 123a is fixed to L. It is preferable that the peg 123a smoothly narrow to the ABS such that there is no sharp edge of the peg 123a, as illustrated in FIG. 1D, in order to effectively propagate the energy of the light which is emitted from the light emitting layer 122 to the NFT.

The peg 123a protrudes along a predetermined direction (the Y axis direction) which intersects with (typically which is perpendicular to) a lamination direction (the X axis direction) of the magnetic head 100. Therefore, the peg 123a protrudes toward the outward side of the magnetic head 100 (in other words, toward the ABS or toward the magnetic recording medium 200 which faces the ABS) along the predetermined direction.

In the first example, focusing on the positional relationship along the predetermined direction (Y axis direction), the edge surface (specifically, the edge surface which is the closest to the ABS, and the edge surface on a plus side along the Y axis in FIG. 1 A to FIG. 1E) of the peg 123a is located at more outward side in the magnetic head 100 than the edge surface (specifically, the edge surface which is the closest to the ABS, and the edge surface on the plus side along the Y axis in FIG. 1 A to FIG. 1E) of the upper electrode layer 121 is. Namely, focusing on the positional relationship along the predetermined direction (Y axis direction), the edge surface of the peg 123a is closer to the ABS than the edge surface of the lower electrode layer 121. In other words, a distance between the edge surface of the peg 123a and the ABS is smaller than a distance between the edge surface of the lower electrode layer 121 and the ABS. Incidentally, it is preferable that the edge surface of the peg 123a and the ABS lie in the same plane, for the purpose of improving a floating character of the magnetic head 100.

According to the near-field light device 120, the light emitting layer 122 emits the light in accordance with the electric current which is applied to the light emitting layer 122 from the lower electrode layer 121 and the upper electrode layer 123. Namely, the light emitting layer 122 generates photon as the energy in accordance with the electric current which is applied to the light emitting layer 122 from the lower electrode layer 121 and the upper electrode layer 123. The energy (namely, the photon) which is generated due to the emission of the light at the light emitting layer 122 is propagated to the NFT by the upper electrode layer 123 and is transformed to the near-field light at the peg 123a which is the NFT. As a result, the energy flows into the magnetic recording medium 200 as the near-field light. Alternatively, the energy (namely, the photon) which is generated due to the emission of the light at the light emitting layer 122 is propagated to the NFT by the upper electrode layer 123 as the surface Plasmon which is generated at the surface of the upper electrode layer 123 and is transformed to the near-field light at the peg 123a which is the NFT. As a result, the energy flows into the magnetic recording medium 200 as the near-field light. In any case, the energy (namely, the photon) which is generated due to the emission of the light at the light emitting layer 122 is pulled by the peg 123a of the upper electrode layer 123. As a result, the energy of the light emitting layer 122 is extracted by the peg 123a as the near-field light and the energy which is extracted as the near-field light heats the nano spot of the magnetic recording medium 200.

Incidentally, considering that the magnetic head 100 is used to perform the HAMR (Heat Assisted Magnetic Recording), if a distance along the lamination direction (namely, the X axis direction in FIG. 1A to FIG. 1E) between the upper electrode layer 123 and the magnetic head layer 112 is too much large, the magnetic head 100 is not capable of performing the HAMR appropriately. This is why it takes too much long time for the magnetic head layer 112 to reach the nano area of the magnetic recording medium 200 whose temperature has increased due to the irradiation of the near-field light by the near-field light device 120 and thus the temperature of the nano area decreases before the magnetic head layer 112 reaches the nano area. On the other hand, if a distance along the lamination direction (namely, the X axis direction in FIG. 1A to FIG. 1E) between the upper electrode layer 123 and the magnetic head layer 112 is too much small, the magnetic head 100 is not capable of performing the HAMR appropriately. This is why the increase of the temperature of the nano area due to the irradiation of the near-field light by the near-field light device 120 may cause an adverse effect on a character of the magnetic head layer 112. Thus, the distance between the upper electrode layer 123 and the magnetic head layer 112 is preferably set to a proper distance by which the HAMR (Heat Assisted Magnetic Recording) can be performed appropriately.

According to the magnetic head 100 in the first example, since the upper electrode layer 123 has the peg 123a, the energy caused by the emission of the light in the light emitting layer 122 can be likely extracted by the peg 123a, compared to the case where the upper electrode layer 123 does not have the peg 123a. Therefore, the magnetic head 100 (specifically, the near-field light device 120 which the magnetic head 100 is provided with) can effectively form, on the magnetic recording medium 200, the nano spot on which the energy is focused.

In addition, since the edge surface of at least one portion of the peg 123a is closer to the ABS than the edge surface of the lower electrode layer 121 is, the energy caused by the emission of the light in the light emitting layer 122 can be extracted from the upper electrode layer 123 (typically, the peg 123a which the upper electrode layer 123 is provided with) more easily rather than from the lower electrode layer 121. Therefore, the magnetic head 100 (specifically, the near-field light device 120 which the magnetic head 100 is provided with) can intensively extract the energy caused by the emission of the light in the light emitting layer 122 via the upper electrode layer 123 (typically, the peg 123a which the upper electrode layer 123 has). Therefore, the magnetic head 100 (specifically, the near-field light device 120 which the magnetic head 100 is provided with) can effectively form, on the magnetic recording medium 200, the nano spot on which the energy is focused.

In addition, according to the magnetic head 100 in the first example, since the light emitting layer 122 is sandwiched by the upper electrode layer 123 having the peg 123a, the energy caused by the emission of the light in the light emitting layer 122 can be directly extracted from the peg 123a via the upper electrode layer 123 which is adjacent to the light emitting layer 122 which is a generation source of the energy. Namely, since the light emitting layer 122 and the peg 123a are not located in positions which are physically away from each other (in other words, in separated positions), the magnetic head 100 does not necessarily have a light guiding path which guides the light from the light emitting layer 122 to the peg 123a which are physically away from each other. As a result, the magnetic head 100 (specifically, the near-field light device 120 which the magnetic head 100 is provided with) is capable of effectively using the energy caused by the emission of the light in the light emitting layer 122, because the loss of the light in the light guiding path is reduced. Namely, the magnetic head 100 (specifically, the near-field light device 120 which the magnetic head 100 is provided with) can effectively form, on the magnetic recording medium 200, the nano spot on which the energy is focused.

(1-2) Manufacturing Method of Magnetic Head

Next, with reference to FIG. 3 to FIG. 10, the manufacturing method of the magnetic head 100 in the first example will be explained. Each of FIG. 3 to FIG. 10 is a perspective view illustrating one manufacturing process of the magnetic head 100 in the first example.

Figure 3:
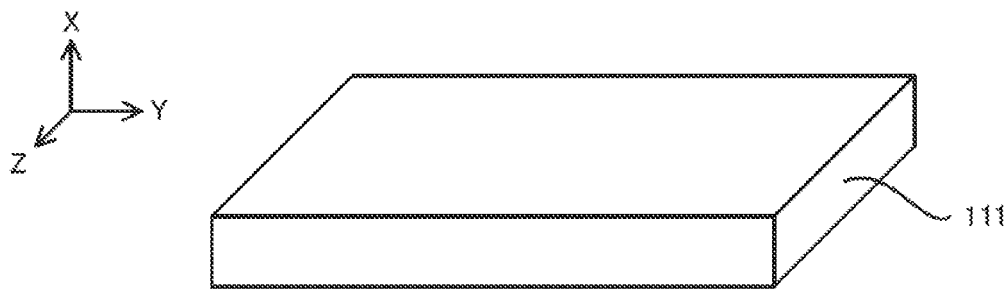
FIG. 3 is a perspective view illustrating one manufacturing process of the magnetic head in the first example.

As illustrated in FIG. 3, firstly, the substrate 111 is prepared.

Figure 4:
FIG. 4 is a perspective view illustrating one manufacturing process of the magnetic head in the first example.

Then, as illustrated in FIG. 4, the magnetic head layer 112 is formed on the substrate 111 by using the semiconductor manufacturing process. Then, as illustrated in FIG. 4, the separating layer 113 is formed on the magnetic head layer 112 by using the semiconductor manufacturing process.

Figure 5:
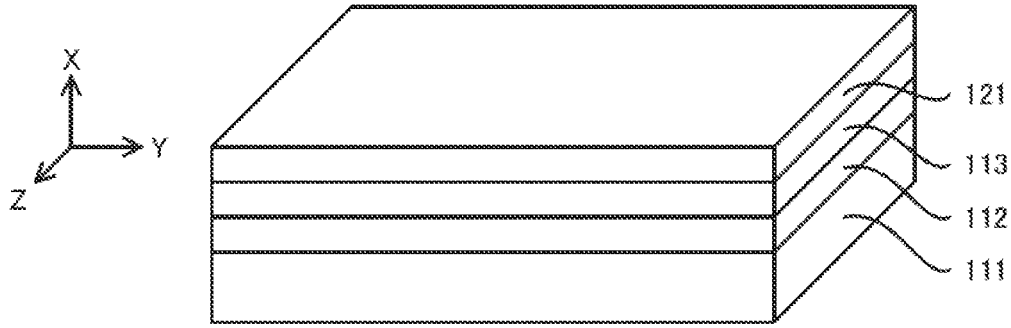
FIG. 5 is a perspective view illustrating one manufacturing process of the magnetic head in the first example.

Then, as illustrated in FIG. 5, the lower electrode layer 121 is formed on the separating layer 113 by using the semiconductor manufacturing process. Incidentally, at this moment, the shape of the lower electrode layer 121 (especially, the shape along the predetermined direction intersecting the laminating direction, and the shape along the YZ plane in FIG. 5) may be same as those of the substrate 111, the magnetic head layer 112 and the separating layer 113.

Figure 6:
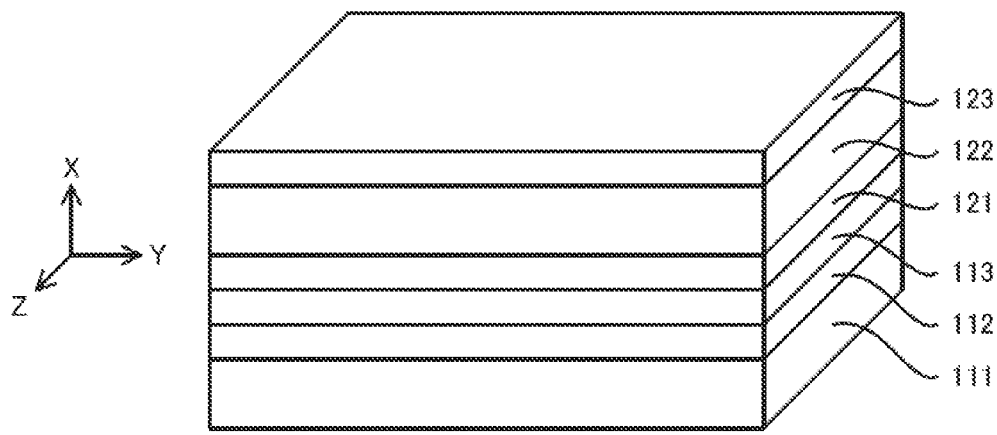
FIG. 6 is a perspective view illustrating one manufacturing process of the magnetic head in the first example.

Then, as illustrated in FIG. 6, the light emitting layer 122 is formed on the lower electrode layer 121 by using the semiconductor manufacturing process. Then, as illustrated in FIG. 6, the upper electrode layer 123 is formed on the light emitting layer 122 by using the semiconductor manufacturing process. Incidentally, at this moment, the shape of the upper electrode layer 123 (especially, the shape along the predetermined direction intersecting the laminating direction, and the shape along the YZ plane in FIG. 5) may be same as those of the substrate 111, the magnetic head layer 112, the separating layer 113, the lower electrode layer 121 and the light emitting layer 122.

Figure 7:
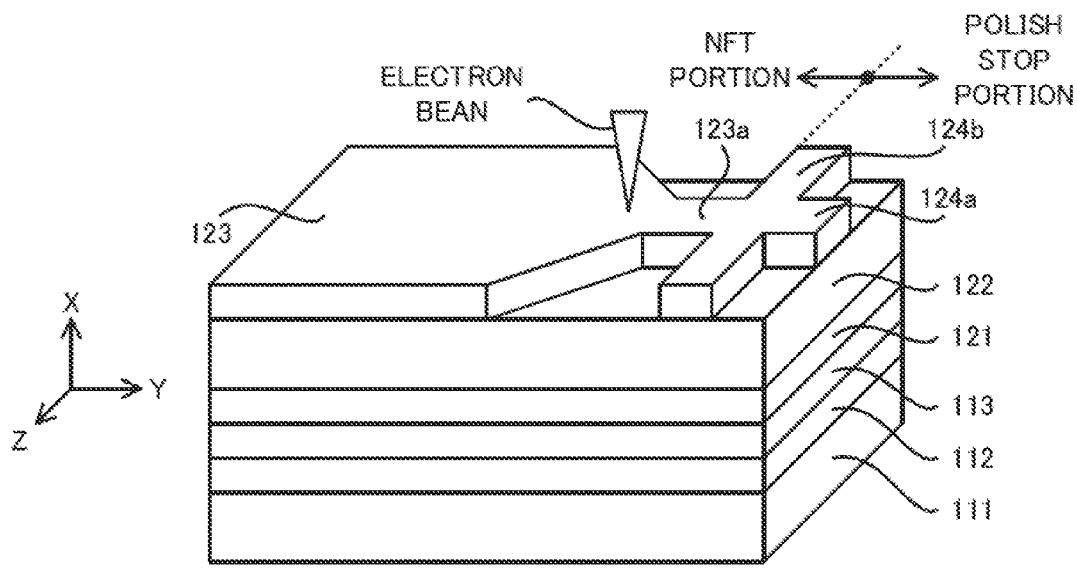
FIG. 7 is a perspective view illustrating one manufacturing process of the magnetic head in the first example.

Then, as illustrated in FIG. 7, the upper electrode layer 123 is patterned. Incidentally, the pattern illustrated in FIG. 7 corresponds to the pattern illustrated in FIG. 1C. At this time, the upper electrode layer 123 is patterned such that the upper electrode layer 123 has a NFT portion and a polish stop portion, wherein the NFT portion is capable of functioning as the NFT (peg 123a) which is used to generate the near-field light, and the polish stop portion is capable of functioning as a stopper in performing a surface polishing of the magnetic head 100 from the ABS side at the below described process and is closer to the ABS than the NFT portion is. Incidentally, the polish stop portion may have a structure in which a plurality of patterns 124a and 124b whose width (a length along the Z axis in FIG. 7) along a polished surface (the XZ plane in FIG. 7) are different from each other are arranged along a direction which is perpendicular to the polished surface (substantially, a direction which is perpendicular to the ABS, and the Y axis direction in FIG. 7). Furthermore, the width (namely, the width along the polished surface) of the pattern 124a of the polish stop portion which is adjacent to the border between the NFT portion and the polish stop portion (namely, adjacent to the structure part which could become the peg 123a) is preferably different from the width of the peg 123a.

Incidentally, FIG. 7 illustrates an example in which the upper electrode layer 123 is patterned by using an electron lithography. However, the upper electrode layer 123 may be patterned by using another method (for example, photolithograph) other than the electron lithography.

Figure 8:
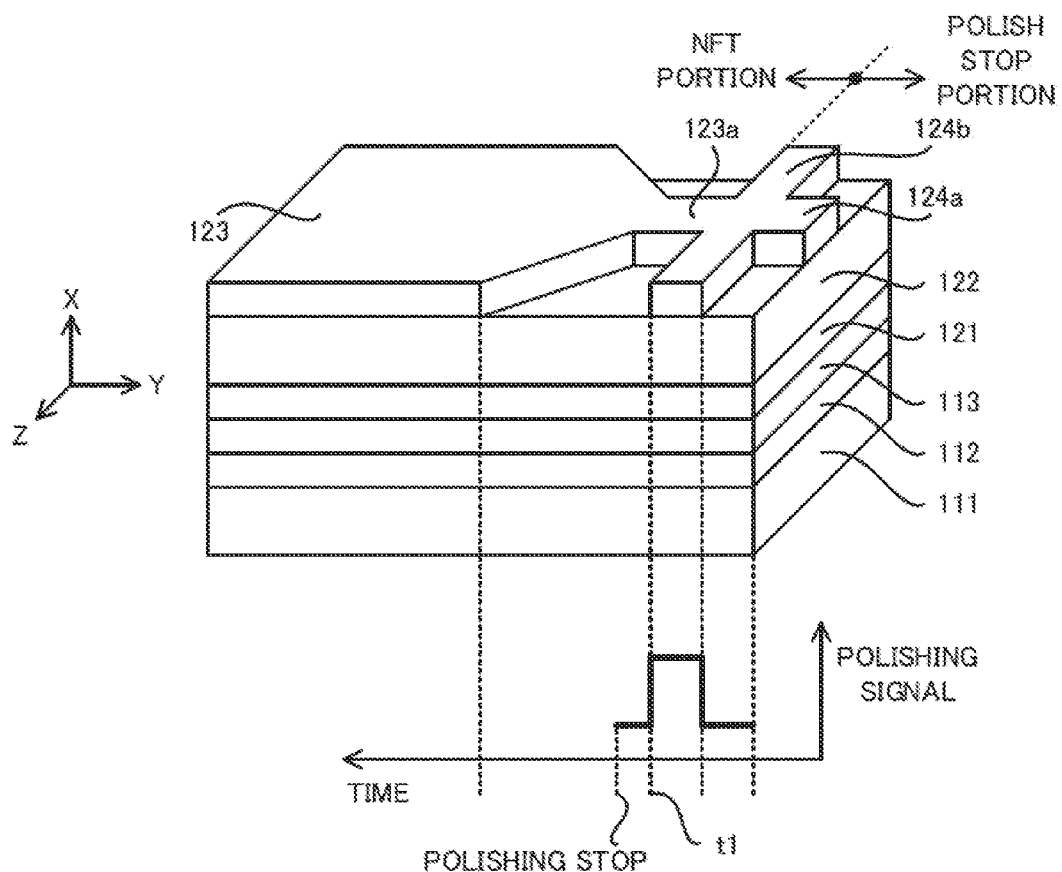
FIG. 8 is a perspective view illustrating one manufacturing process of the magnetic head in the first example.

Then, as illustrated in FIG. 8, the surface polishing (for example, CMP: Chemical Mechanical Polishing) of the magnetic head 100 is performed from the ABS side. Here, since the plurality of patterns 124a and 124b whose widths are different from each other are arranged along a direction which is perpendicular to the polished surface and the width of the pattern 124a of the polish stop portion which is adjacent to the border between the NFT portion and the polish stop portion is different from the width of the peg 123a, a polishing signal which indicates a polishing condition (for example, a polishing pressure) of the surface polishing varies as time passes as illustrated in a graph described in the lower side of FIG. 8. Specifically, the polishing signal in performing the surface polishing of the pattern 124a is different from the polishing signal in performing the surface polishing of the pattern 124b. Similarly, the polishing signal in performing the surface polishing of the pattern 124b is different from the polishing signal in performing the surface polishing of the peg 123a. Therefore, if the surface polishing is stopped after a predetermined time has elapsed since the timing when the polishing signal changes from the polishing signal in performing the surface polishing of the pattern 124b to the polishing signal in performing the surface polishing of the peg 123a, the peg 123a with a desired length (specifically, a length along the Y axis in FIG. 8, and for example 50 nano-meter or less) can be formed relatively easily.

Figure 9:
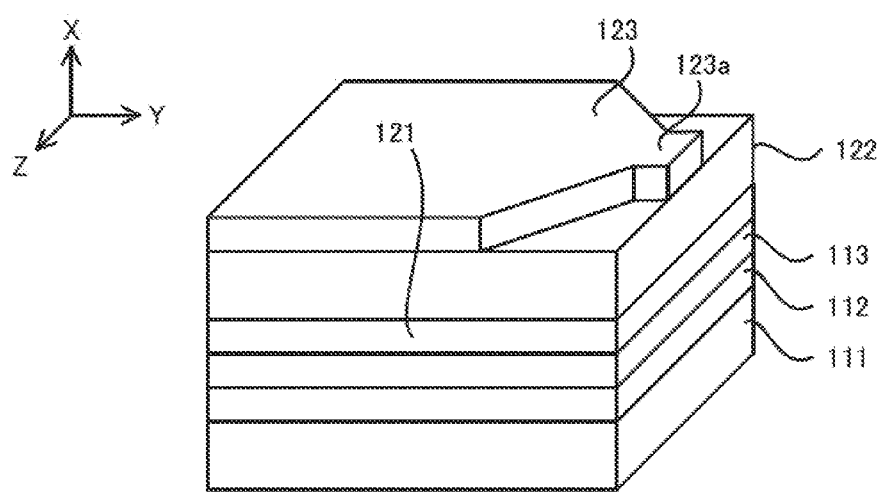
FIG. 9 is a perspective view illustrating one manufacturing process of the magnetic head in the first example.

After the surface polishing is completed, as illustrated in FIG. 9, the magnetic head 100 having the peg 123a with the desired length is manufactured.

Figure 10:
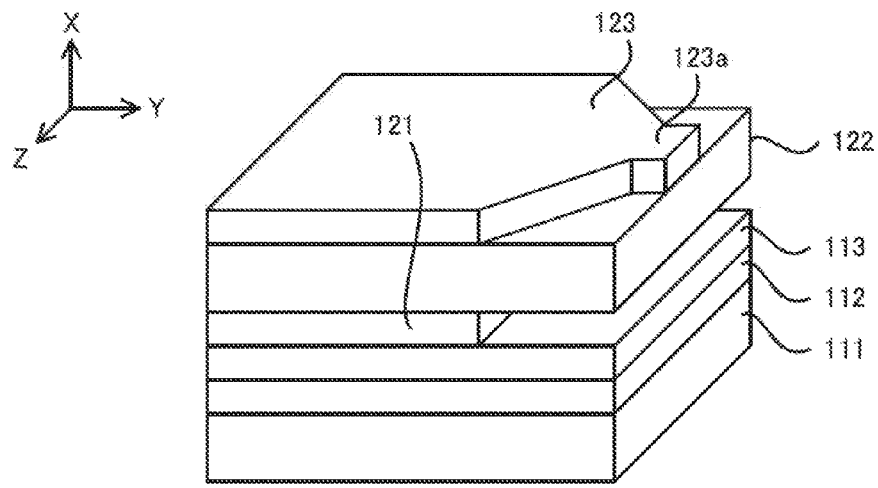
FIG. 10 is a perspective view illustrating one manufacturing process of the magnetic head in the first example.

Then, as illustrated in FIG. 10, the lower electrode layer 121 is selectively etched such that the edge surface of the peg 123a is located at more outward side in the magnetic head 100 than the edge surface of the lower electrode layer 121 is. The selective etching of the lower electrode layer 121 is relatively easily realized by making the etching character of the lower electrode layer 121 be different from the etching character of the upper electrode layer 123 (furthermore, another layer).

Incidentally, the lower electrode layer 121 is patterned in advance at the timing when the lower electrode layer 121 is formed such that the edge surface of the peg 123a is located at more outward side in the magnetic head 100 than the edge surface of the lower electrode layer 121 is, in addition to or instead of the selective etching. In this case, the etching character of the lower electrode layer 121 may be same as the etching character of the upper electrode layer 123 (furthermore, another layer).

As described above, in the first example, the magnetic head 100 is manufactured by using a laminating process which laminates the magnetic head layer 112, the separating layer 113, the lower electrode layer 121, the light emitting layer 122 and the upper electrode layer 123 on the substrate 111. Therefore, the magnetic head 100 in the first example can be manufactured effectively or relatively easily.

Especially, in the first example, the magnetic head 100 is manufactured by using the above described laminating process instead of a manufacturing method which bonds the magnetic device 110 and the near-field light device 120 after separately manufacturing the magnetic device 110 and the near-field light device 120. Therefore, in the first example, since the manufacturing process of the magnetic head 100 is simplified, the manufacturing cost of the magnetic head 100 is reduced.

(1-3) Modified Example

Figure 11A:
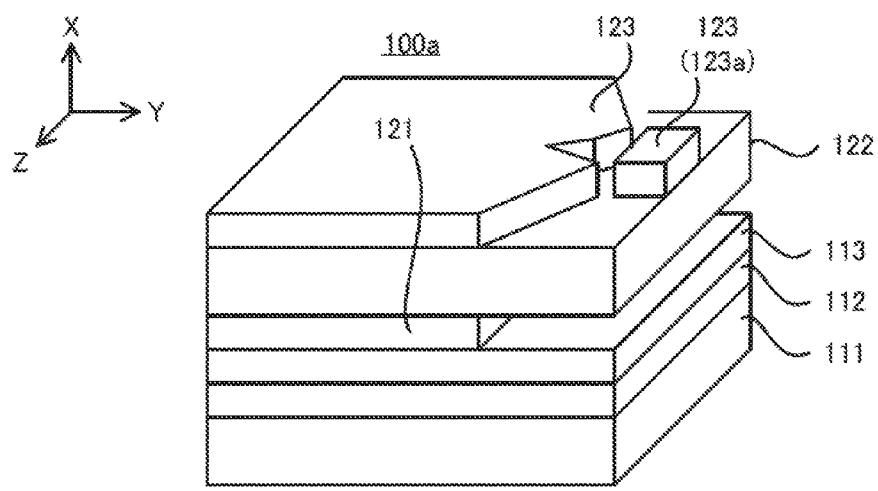
FIG. 11A is a perspective view illustrating a configuration of a modified example of the magnetic head in the first example and FIG. 11B is a top view illustrating a configuration of the modified example of the magnetic head in the first example.
Figure 11B:
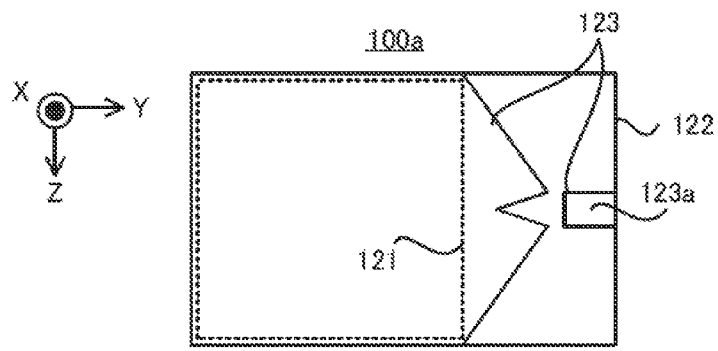

Next, with reference to FIG. 11A and FIG. 11B, a modified example of the magnetic head 100 in the first example will be explained. FIG. 11A is a perspective view illustrating a configuration of the modified example of the magnetic head 100 in the first example and FIG. 11B is a top view illustrating a configuration of the modified example of the magnetic head 100 in the first example As illustrated in FIG. 11A and FIG. 11B, the magnetic head 100a in the modified example is different from the above described magnetic head 100 whose peg 123a is physically unified with the upper electrode layer 123 in that the peg 123a is physically separated from the upper electrode layer 123. Even the magnetic head 100a in the modified example can enjoy the above described various effect.

(2) Second Example

Next, with reference to FIG. 12 to FIG. 18, a near-field light device in the second example will be explained.

(2-1) Configuration of Near-Field Light Device

Figure 12:
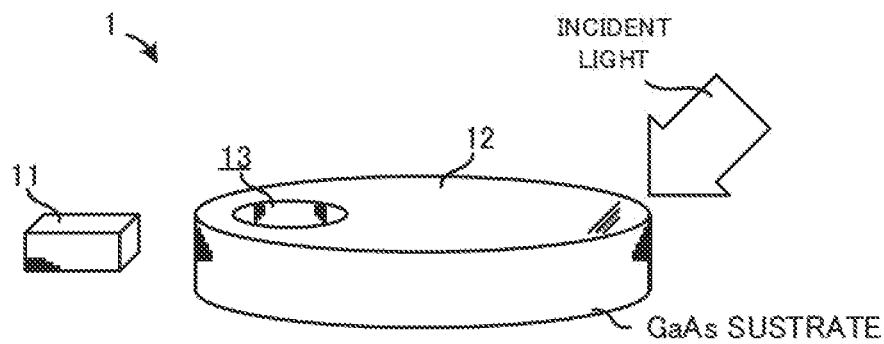
FIG. 12 is a perspective view of a general configuration of a near-field light device in the second example.

Firstly, with reference to FIG. 12, a configuration of the near-field light device 1 in the second example will be explained. FIG. 12 is a perspective view illustrating a configuration of the near-field light device 1 in the second example.

As illustrated in FIG. 12, the near-field device 1 in the second example is provided with: a metal rod 11 which is made from a metal such as gold (Au) or the like, for example; a micro disk 12 which is made from a semiconductor such as GaAs or the like. Especially, a hole 13 is formed in the micro disk 12 such that the hole 13 extends from an upper surface of the micro disk 12 to a lower surface of the micro disk 12. Incidentally, the "metal rod 11" is one example of the "generator which generates the near-field light". The "micro disk 12" is one example of the "micro resonator".

A light guiding path is located in the vicinity of the micro disk 12, although it is not illustrated in FIG. 12. The light guiding path is configured to guide the light which is emitted from a light source to the micro disk 12 (see "incident light" in FIG. 12). Incidentally, the light may be guided to the micro disk 12 along various incident directions which is different from the incident direction illustrated in FIG. 12. Moreover, the micro disk 12 may be a micro disk layer which emits the light by itself.

If the hole, a sharp edge or the like is formed in the micro disk 12 or if a material of the micro disk 12 is distributed disproportionately, energy which is caused by the light which is irradiated with the micro disk 12 is disproportionately stored in the micro disk 12. For example, see the Literature "Trend in Nano- and Micro Cavities, 2011, 109-152 Chapter 4 "Review on unidirectional light emission from ultralowloss modes in deformed microdisks", Jan Wiersig, Julia Unterhinninghofen, Institute fur Theoretische Physik, Universitat Magdeburg, Postfach 4120, D-39016 Magdeburg, Germany".

So, the inventors of the present application proposes the near-field light device in which the metal rod 11 or a metal particle is located in the vicinity of or to contact with a position in the micro disk 12 where the energy level is relatively high (see FIG. 12). Incidentally, the position in the micro disk 12 where the energy level is relatively high can be determined by an experiment or a simulation or experientially.

As described above, in the second example, the energy is extracted from the asymmetric micro disk 12 in which the hole, the sharp edge or the like is formed by the metal rod 11 or the metal particle to generate the nano near-field light, and thus the nano spot on which the energy of the near-filed light is focused is formed. If the near-field light device 1 is put to practical use, the near-field light device 1 can be used for specific application, which needs a nano light source or the nano spot on which the energy is focused, such as the HAMR (Heat Assisted Magnetic Recording), an accumulated light source for an optical communication, a nano illumination, a near-field light microscope or the like.

If the light is irradiated with the micro disk 12 in which the hole 13 is formed when the near-field light device 1 operates, the energy is disproportionately stored in the micro disk 12 (specifically, more energy is likely stored into a portion of the micro disk 12 which is closer to the metal rod 11). As a result, if the metal rod 11 is located in the vicinity of the hole 13 (or is located to contact a side surface of the micro disk 12 in the vicinity of the hole 13), more energy can be extracted from the micro disk 12, compared to the micro disk on which the hole, the sharp edge or the like is not formed.

Thus, the metal rod 11 is capable of generating the near-field light appropriately. A size of the metal rod 11 may be adjusted depending on a desired size of the nano spot, because the size of the nano spot due to the near-field light depends on the size of the metal rod 11. The metal article may be used instead of the metal rod 11.

Incidentally, according to the configuration of the recording head for the HAMR (Heat Assisted Magnetic Recording) disclosed in each of the above described Patent Literatures 1 to 4, the laser light is focused by using an objective lens and the light guiding path. However, the spot radius of the focused light cannot be equal to or less than a wavelength of the light. On the other hand, a size of a metal conductor which is a generator to generate the near-field light is equal to or less than the wavelength of the light. For example, the size of a metal conductor which is a generator to generate the near-field light is equal to or less than a few dozen nano-meter. Thus, a large portion of the focused light does not contribute to the generation of the near-field light, and thus a use efficiency of the light is low.

Incidentally, the "micro disk" is not limited to the "disk". The micro disk may be a board or a plate. In the second example, the "disk" is not limited to an exact circle, and may be a shape having a roundness such as an ellipse or the like.

(2-2) Modified Example

Figure 13:
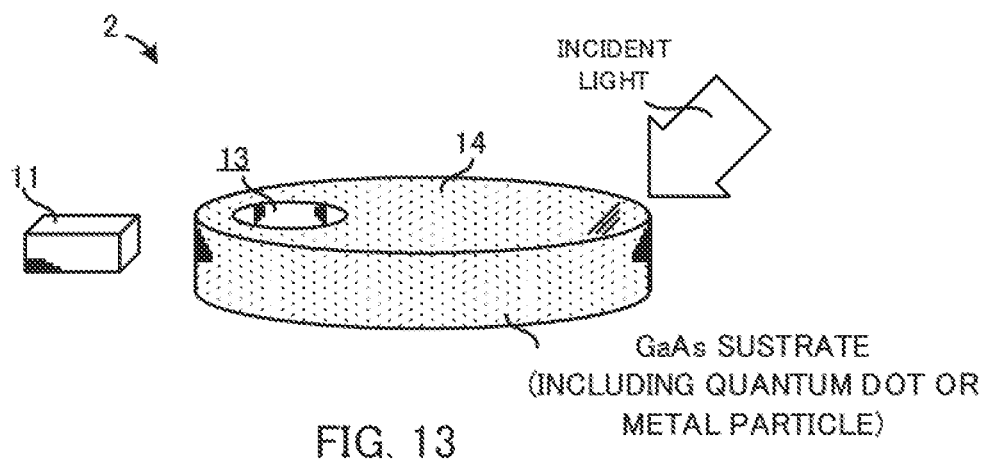
FIG. 13 is a perspective view of a general configuration of one modified example of the near-field light device in the second example.
Figure 14:
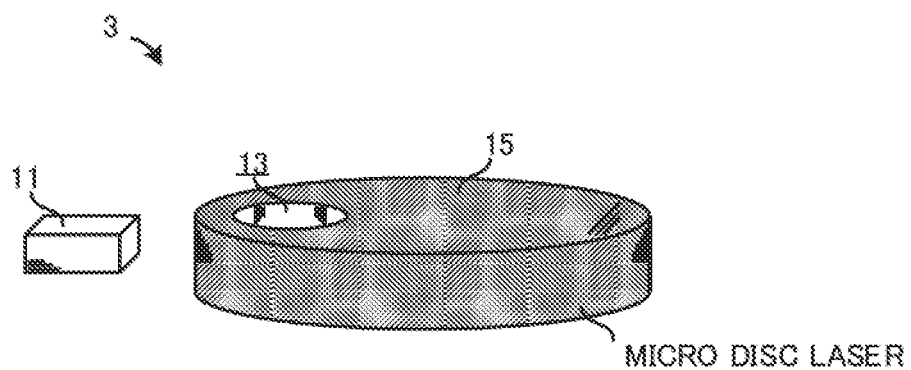
FIG. 14 is a perspective view of a general configuration of another modified example of the near-field light device in the second example.
Figure 15:
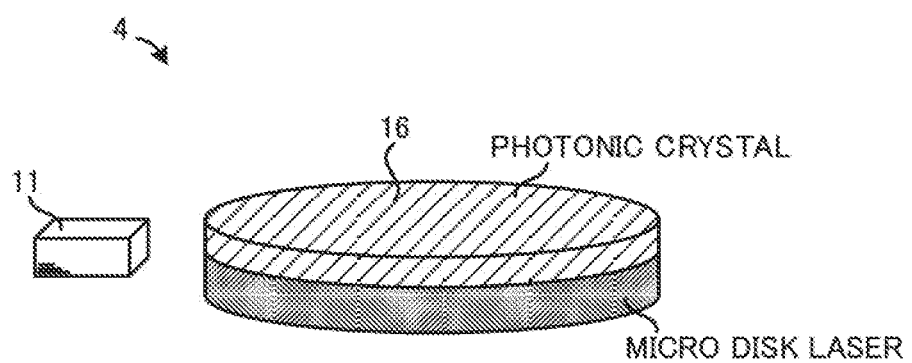
FIG. 15 is a perspective view of a general configuration of another modified example of the near-field light device in the second example.
Figure 16A:
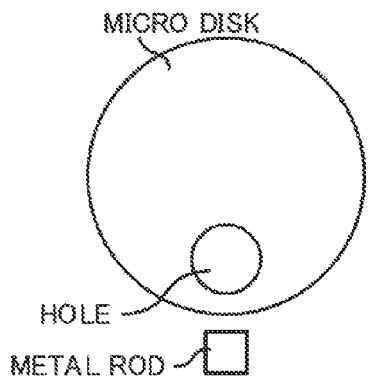
FIG. 16A is a planar view of one modified example of a micro disk in the second example.
Figure 16B:
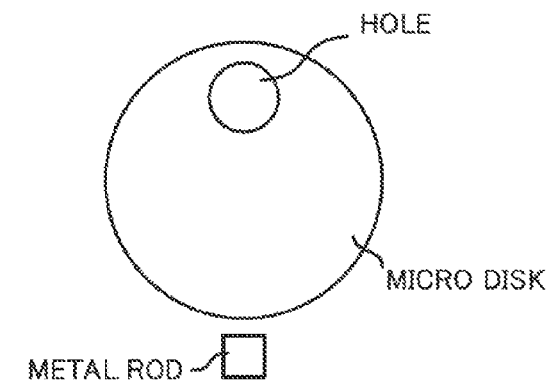
FIG. 16B is a planar view of another modified example of a micro disk in the second example.
Figure 16C:
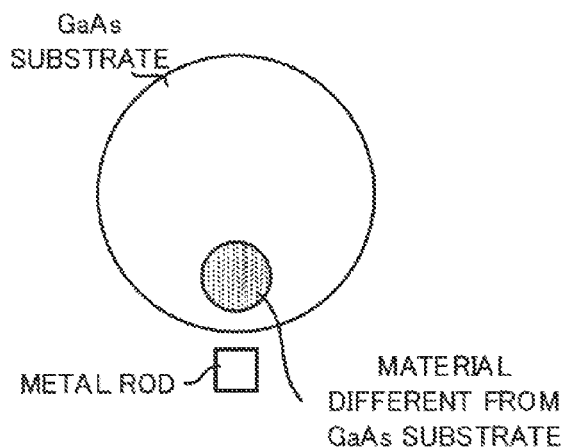
FIG. 16C is a planar view of another modified example of a micro disk in the second example.
Figure 16D:
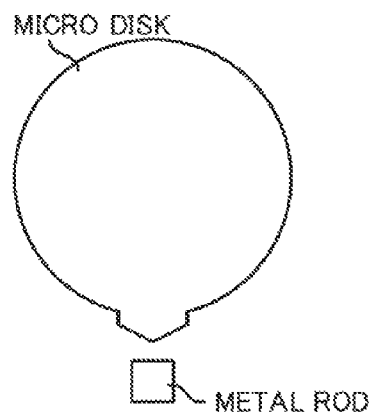
FIG. 16D is a planar view of another modified example of a micro disk in the second example and FIG. 16E is a planar view of another modified example of a micro disk in the second example.
Figure 16E:
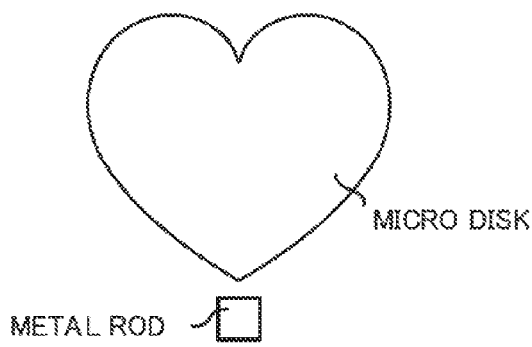

Next, with reference to FIG. 13 to FIG. 16, modified examples of the near-field light device 1 in the second example will be explained. FIG. 13 is a perspective view of a general configuration of one modified example of the near-field light device 1 in the second example. FIG. 14 is a perspective view of a general configuration of another modified example of the near-field light device 1 in the second example. FIG. 15 is a perspective view of a general configuration of another modified example of the near-field light device 1 in the second example. FIG. 16A is a planar view of one modified example of the micro disk 12 in the second example, FIG. 16B is a planar view of another modified example of the micro disk 12 in the second example, FIG. 16C is a planar view of another modified example of the micro disk 12 in the second example, FIG. 16D is a planar view of another modified example of the micro disk 12 in the second example and FIG. 16E is a planar view of another modified example of the micro disk 12 in the second example.

As illustrated in FIG. 13, the hole 13 is formed in a micro disk 14 such that the hole 13 extends from an upper surface of the micro disk 14 to a lower surface of the micro disk 14. The micro disk 14 is made of the GaAs substrate which includes the plurality of quantum dots made from the InAs or the like or which includes the plurality of metal nano-particles. In this case, an absorption efficiency of the light which is irradiated with the micro disk 14 can be improved. A semiconductor substrate may be a silicon based substrate. The metal nano-particle may be a single metal or alloy, which is selected in accordance with the incident light irradiated with the micro disk 14, such as gold (Au), silver (Ag) or the like.

A band gap can be freely controlled by controlling the size of the quantum dot. Thus, the micro disk 14 can be appropriately designed such that the micro disk 14 can absorb the light with any wavelength. For example, white light emitted from a LED (Light Emitting Diode) can be used as the incident light and the micro disk 14 can absorb the light whose wavelength adapts to the size of the quantum dot. Thus, a light source other than the laser light source can be used to emit the light as the incident light.

As illustrated in FIG. 14, a near-filed light device 3 is provided with a micro disk laser 15 as the micro disk. The near-filed light device 3 is practically advantageous because the light source, the light guiding path and the like are not necessarily prepared separately.

As illustrated in FIG. 15, a micro disk 16 of a near-field device 4 is provided with the micro disk laser and a photonic crystal layer which is laminated on the micro disk laser. Thus, confinement efficiency of the light in the micro disk 16 can be improved. Incidentally, as the micro disk laser illustrated in FIG. 15, the micro disk laser in which the hole illustrated in FIG. 14 is formed may be used.

The micro disk is not limited to the micro disk whose shape is the disk and in which the hole is formed as illustrated in FIG. 16A and FIG. 16B. Incidentally, the near-field device illustrated in FIG. 16A corresponds to the near-field device 1 illustrated in FIG. 12. For example, as illustrated in FIG. 16C, the micro disk may be made of the GaAs substrate into which a bundle of a material (for example, Si, GaN or the like) which is different from GaAs is embedded. Moreover, as illustrated in FIG. 16D, the micro disk may be a disk which has a protrusion at its side surface. Furthermore, the micro disk is not limited to the disk, and may be a shape different from the disk such as a heart shape illustrated in FIG. 16E.

In each example other than the example illustrated in FIG. 16B, the metal rod is located in the vicinity of the hole or the protrusion (or the sharp edge) or to contact the protrusion (or the sharp edge). Even in the case where the sharp edge is formed, the energy is disproportionately stored in the micro disk, in a same manner in the case where the hole is formed. Thus, more energy can be extracted by locating the metal rod in the vicinity of the sharp edge.

Incidentally, in FIG. 16C, the "GaAs substrate" is one example of the "first portion" and the "bundle of the material different from the GaAs substrate" is one example of the "second portion". Various combinations of the materials can be used as the combination of the "first portion" and the "second portion".

(2-3) Applied Example

Figure 17:
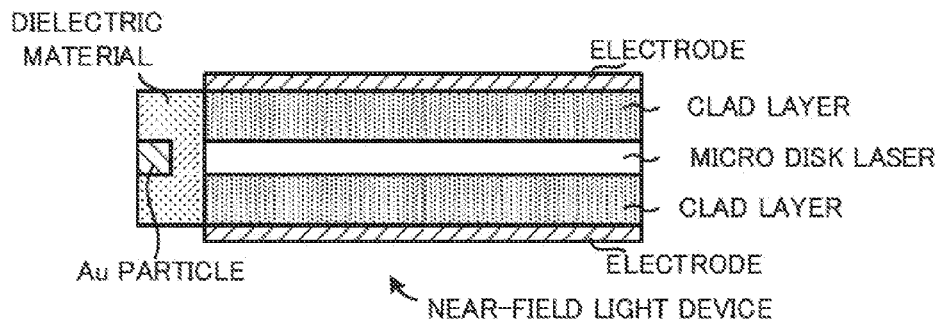
FIG. 17 is a diagram illustrating one example of an aspect which can be applied to a magnetic head having a near-field light device in the applied example.
Figure 18:
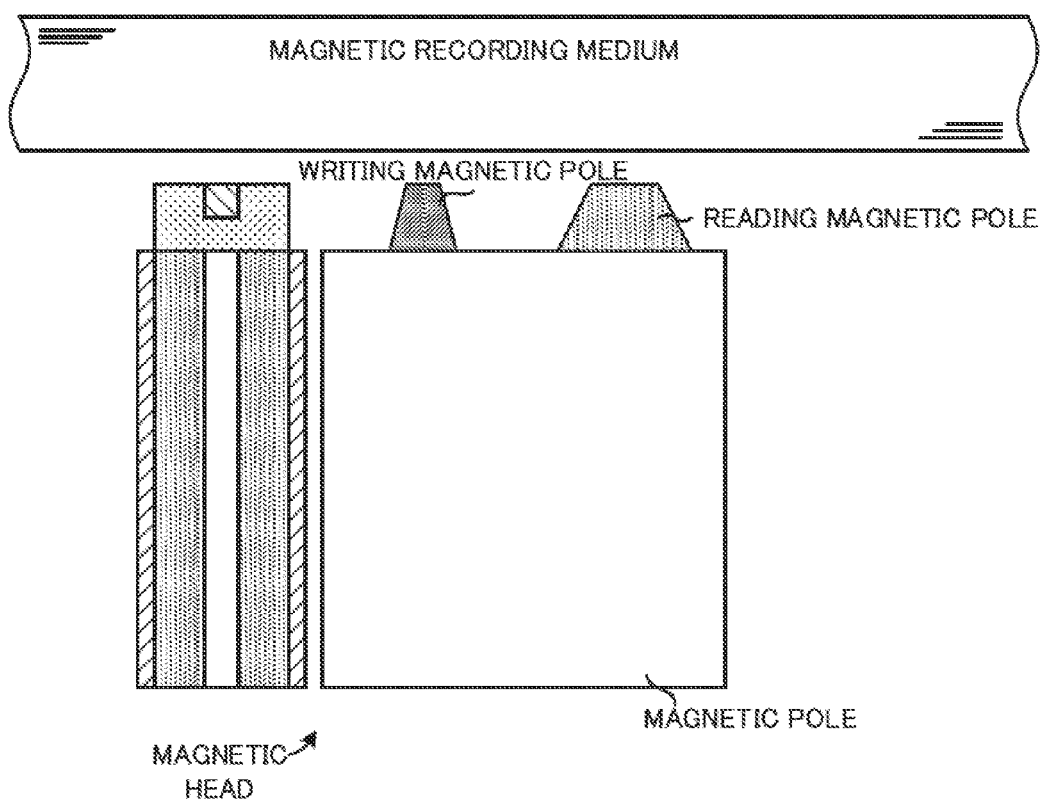
FIG. 18 is a diagram illustrating one example of a magnetic recording using the magnetic head in the applied example.

Next, with reference to FIG. 17 and FIG. 18, a magnetic recording using a near-field device in the applied example as a magnetic head of the HAMR (Heat Assisted Magnetic Recording) will be explained. FIG. 17 is a diagram illustrating one example of an aspect which can be applied to the magnetic head having the near-field light device in the applied example. FIG. 18 is a diagram illustrating one example of the magnetic recording using the magnetic head in the applied example.

As illustrated in FIG. 17, the near-field device is provided with: the micro disk laser; clad layers which are laminated on an upper surface of the micro disk laser and a lower surface of the micro disk layer, respectively; and electrodes which are used to supply electric power to the micro disk laser. Non-illustrated external power source supplies the electric power to the electrodes. As a result, the micro disk laser emits light. The micro disk laser may be the micro disk laser illustrated in at least one of FIG. 12 to FIG. 16.

A gold particle (Au particle) which is one example of the metal rod (see FIG. 12, for example) is coupled to a side surface of the micro disk laser via a dielectric material. The micro disk laser and the gold particle are arranged such that the micro disk laser is away from the gold particle by a distance which having a near-field interaction. Moreover, the side surface of the micro disk laser may contact the gold particle.

Next, with reference to FIG. 18, one example of the magnetic recording will be explained. In a configuration illustrated in FIG. 18, the micro disk laser emits light by the electric power which is supplied to the electrodes of the near-field device in accordance with an input signal. Then, the near-field light is generated at the gold particle and one portion of the magnetic recording medium which faces the gold particle, due to the emission of the light at the micro disk laser. Then, the energy is propagated to the magnetic recording medium due to the near-field light. As a result, coercive force of the nano area of the magnetic recording medium to which the energy is propagated decreases. Thus, the magnetic recording can be performed easily by the writing magnetic pole. On the other hand, a recording signal which is recorded into the magnetic recording medium is read by the reading magnetic pole.

Incidentally, at least one portion of various configurations in the above described first example and at least one portion of various configurations in the above described second example may be combined to each other. For example, considering that the "light emitting layer 122" and the "peg 123a" in the first example corresponds to the "micro disk 12" and the "metal road 13", the hole 13 may be formed in the light emitting layer 122 which the near-field light device 120 in the first example is provided with, in a same manner in the micro disk 12 in the second example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention. An optical device, a magnetic head, a manufacturing method and a near-field light device, which involve such changes, are also intended to be within the technical scope of the present invention.

DESCRIPTION OF REFERENCE CODES 1, 2, 3, 4 near-field light device
11 metal rod
12, 14, 15, 16 micro disk
100 magnetic head
110 magnetic device
120 near-field light device
121 lower electrode layer
122 light emitting layer
123 upper electrode layer
123a peg

What is claimed is:
1. An optical device comprising:
a first electrode layer having a protruding portion;
a second electrode layer; and
a light emitting layer which is sandwiched between the first electrode layer and the second electrode layer,
wherein
the protruding portion protrudes along a predetermined direction to be capable of extracting energy which is caused by emission of light at the light emitting layer, wherein the predetermined direction intersects with a laminated direction along which the first electrode layer, the second electrode layer and the light emitting layer are laminated,
an edge surface of at least one portion of the projection portion is located at more outward side in the optical device along the predetermined direction than an edge surface of the second electrode layer is.
2. The optical device according to claim 1 further comprising a facing surface which faces a desired medium along the predetermined direction,
the edge surface of at least one portion of the projection portion is closer to the facing surface than the edge surface of the second electrode layer is.
3. The optical device according to claim 1, wherein
the protruding portion generates near-field light by extracting the energy which is caused by the emission of the light at the light emitting layer.
4. A manufacturing method of manufacturing the optical device according to claim 1,
the manufacturing method comprising:
forming one of the first electrode layer and the second electrode layer;
forming the light emitting layer such that the light emitting layer is laminated on the one of the first electrode layer and the second electrode layer; and
forming the other one of the first electrode layer and the second electrode layer such that the other one of the first electrode layer and the second electrode layer is laminated on the light emitting layer.
5. The manufacturing method according to claim 4 further comprising:
patterning the first electrode layer such that one portion of the first electrode layer protrudes along the predetermined direction and thus the first electrode is to have the protruding portion; and eliminating one portion of the second electrode layer such that the edge surface of at least one portion of the projection portion is located at more outward side in the optical device than the edge surface of the second electrode layer is.

6. A magnetic head comprising:
a first electrode layer;
a second electrode layer;
a light emitting layer which is sandwiched between the first electrode layer and the second electrode layer; and
a magnetic device which performs at least one of a recording operation and a reproducing operation with respect to a magnetic recording medium,
wherein
the first electrode layer has a generator which generates near-field light and which is exposed to a ABS (Air Bearing Surface) surface of the magnetic head.

7. A magnetic head comprising:
an optical device; and
a magnetic device which is performs at least one of a recording operation and a reproducing operation with respect to a medium,
wherein
the optical device comprises:
a first electrode layer having a protruding portion;
a second electrode layer; and
a light emitting layer which is sandwiched between the first electrode layer and the second electrode layer,
the protruding portion protrudes along a predetermined direction to be capable of forming a heat spot on the medium which faces the optical device by extracting energy which is caused by emission of light at the light emitting layer, wherein the predetermined direction intersects with a laminated direction along which the first electrode layer, the second electrode layer and the light emitting layer are laminated,
an edge surface of at least one portion of the projection portion is located at more outward side in the optical device than an edge surface of the second electrode layer is.

8. The magnetic head according to claim 7, wherein
the second electrode layer is closer to the magnetic device than the first electrode layer is.

9. A manufacturing method of manufacturing the magnetic head according to claim 7,
the manufacturing method comprising:
forming the magnetic device;
forming one of the first electrode layer and the second electrode layer such that one of the first electrode layer and the second electrode layer is laminated on the magnetic device;
forming the light emitting layer such that the light emitting layer is laminated on the one of the first electrode layer and the second electrode layer; and
forming the other one of the first electrode layer and the second electrode layer such that the other one of the first electrode layer and the second electrode layer is laminated on the light emitting layer.

* * * * *